United States Patent
Eng

(10) Patent No.: US 6,489,842 B2
(45) Date of Patent: Dec. 3, 2002

(54) MULTIPLE TRAVELING WAVE TUBE AMPLIFIER ELECTRONIC POWER CONDITIONER WITH CENTRALIZED LOW VOLTAGE AND DISTRIBUTED HIGH VOLTAGE

(75) Inventor: John E. Eng, Buena Park, CA (US)

(73) Assignee: The Boeing Company, Seattle, WA (US)

( * ) Notice: Subject to any disclaimer, the term of this patent is extended or adjusted under 35 U.S.C. 154(b) by 125 days.

(21) Appl. No.: 09/755,392

(22) Filed: Jan. 5, 2001

(65) Prior Publication Data

US 2002/0089372 A1 Jul. 11, 2002

(51) Int. Cl.[7] ................................................. H03F 3/58

(52) U.S. Cl. ...................... 330/43; 330/124 R; 330/127

(58) Field of Search .............................. 330/43, 124 R, 330/127, 297; 315/3.5, 39.3

(56) References Cited

U.S. PATENT DOCUMENTS 6,304,466 B1 * 10/2001 Clem et al. ............. 330/297 X

* cited by examiner

Primary Examiner—Steven J. Mottola
(74) Attorney, Agent, or Firm—DiPinto & Shimokaji, P.C.

(57) ABSTRACT

A microwave tube system for use with a spacecraft telecommunication system is provided. The system includes a traveling wave tube subsystem, a high voltage converter subsystem, and a low voltage converter subsystem. The traveling wave tube subsystem includes a plurality of traveling wave tubes. The high voltage converter subsystem powers the traveling wave tube subsystem. The high voltage converter subsystem includes a plurality of high voltage converter members that are paired with the traveling wave tubes on a one-to-one basis. The low voltage converter subsystem is a central power conditioner subsystem including a plurality of low voltage power conditioners that are connected in parallel to one another. A common power output of the central power conditioner subsystem is received by the high voltage converter members which in turn power the traveling wave tubes that are paired with the high voltage converters. Such configured central power conditioner subsystem requires less circuitry and fewer low voltage power conditioners thereby resulting in lower spacecraft weight and volume.

34 Claims, 2 Drawing Sheets

MULTIPLE TRAVELING WAVE TUBE AMPLIFIER ELECTRONIC POWER CONDITIONER WITH CENTRALIZED LOW VOLTAGE AND DISTRIBUTED HIGH VOLTAGE

BACKGROUND OF THE INVENTION

1. Field of the Invention

The present invention generally relates to power converters and, more particularly, to traveling wave tube amplifier electronic power conditioners.

2. Description of the Related Art

In satellite communications, multiple carrier frequencies are separately amplified by individual high power amplifiers such as traveling wave tube (TWT) radio frequency (RF) amplifiers. A traveling wave tube amplifier is a microwave device that contains a vacuum tube known as a traveling wave tube. In general, a TWT amplifies an RF signal inputted to the device after the signal is received by a receiver of the satellite and demultiplexed through a demultiplexer. The amplified RF signal may then be multiplexed and transmitted through a transmitter. Several voltages must be supplied to the TWT to make it perform its amplification function. TWTs on a satellite are usually integrated with a number of power converters or power conditioners that accept a single voltage from a power bus or a power source and generate the various voltages required for the TWT.

The assembly consisting of the various power supplies and their control circuitry is sometimes called an Electronic Power Conditioner (EPC). An EPC usually contains equal number of high voltage and low voltage converters and their related circuitry. Further, an assembly consisting of a TWT and its EPC is called a Traveling Wave Tube Amplifier (TWTA). Historically, EPCs have been designed as singles to provide power to one TWT, or as duals to provide power to two TWTs. With the increasing power capability of spacecraft, over a hundred TWTAs can advantageously be put on a commercial communication satellite. However, one problem with this approach is the amount of EPC circuitry that every single TWT requires and the high cost of deploying such weight into outer space.

In general, the deployment cost of a spacecraft depends significantly on the spacecraft weight and volume. Weight of a spacecraft, in turn, depends partially on the amount of the power conditioning circuitry in the EPCs that needs to be distributed over the available surface area of the spacecraft. Increasing the number of TWTAs increases the spacecraft weight and the volume needed for containing the EPC circuitry. An increase in spacecraft weight and volume leads to increased spacecraft costs. Thus, there are drawbacks in the conventional systems using multiple TWTAs in a spacecraft. Conventional, multiple TWTA systems increase spacecraft weight and require an undesirably large amount of prime surface area especially for EPC circuitry.

In light of the foregoing, a need therefore exists in the current spacecraft technology for a method that reduces the amount of power conditioning circuitry while maintaining the ability to meet multiple TWT specific requirements.

SUMMARY OF THE INVENTION

In one aspect of the present invention, a microwave tube system for use with a spacecraft telecommunication system comprises a microwave tube subsystem, a first voltage converter subsystem electrically connected to and powers the microwave tube system, and a second voltage converter subsystem electrically connected to the first voltage converter subsystem. The microwave tube subsystem includes a plurality of microwave tubes. The first voltage converter subsystem includes a plurality of first voltage converter members. The plurality of the microwave tube members are paired with the plurality of the first voltage converter members on a one-to-one basis through an output connector of the first voltage converter members. The second voltage converter subsystem includes a plurality of second converter members connected in parallel to one another and a first predetermined power output of the second converter subsystem powers the first voltage converter subsystem.

In another aspect of the present invention, a power system for use with a traveling wave tube amplifier system on a spacecraft comprises a power controller, a low voltage converter unit, a high voltage converter unit, and a traveling wave tube unit. The power controller regulates a first power output from a first power supply, such as a solar array, and transforms the first power output into a regulated power output. The low voltage converter unit receives the regulated power output and converts the regulated power output into a first predetermined power output. The low voltage converter unit comprises a first number of low voltage converter members connected in parallel to one another. The high voltage converter unit comprises a second predetermined number of high voltage converter members electrically connected to the low voltage converter unit. The second predetermined number is higher than the first predetermined number. Each of the high voltage converter members receives the first predetermined power output of the low voltage converter unit and generates a high voltage power output for one TWT. There are a plurality of traveling wave tube members. The tube members are paired with the high voltage converter members on a one-to-one basis such that the high voltage output of one of the high voltage members is received by one of the traveling wave tube members. The number of pairs equals the second predetermined number.

These and other features, aspects and advantages of the present invention will become better understood with reference to the following drawings, description and claims.

DESCRIPTION OF THE PREFERRED EMBODIMENT

While the present invention is described in the context of a spacecraft, the invention is not so limited. Accordingly, the present invention may be used in a terrestrial vehicle or other applications where weight and volume savings from power circuitry may be advantageous.

As will be described below, in a first embodiment, a central electrical power supply (CPS) of the present invention provides a predetermined output voltage ($V_{reg}$) to a set of high voltage converters required to operate a set of traveling wave tubes (TWTs). As opposed to the prior art TWTAs, the central EPC or CPS offers the advantages of a single EPC, or dual EPCs, by combining a plurality of low voltage converters and their circuitry into a common redundant CPS for reduced payload mass and increased layout efficiency. By combining the low voltage circuitry of the EPCs into a common redundant CPS, fewer low voltage converters and less circuitry is required thus resulting in a lower weight and volume. As mentioned, in this configuration the output voltage ($V_{reg}$) provides the required input voltage for the high voltage converters of the TWTAs. In addition, by reducing the number of low voltage converters, less power is consumed in "house keeping" circuits, resulting in improved efficiency. Also the magnitude of the output voltage ($V_{reg}$) of the CPS can be chosen such that the efficiency and size as well as the performance of the high voltage converters are optimized. Another significant benefit is that, with this standardized $V_{reg}$ CPS output voltage, the same high voltage converters can be used on a variety of available spacecraft systems allowing for improved product standardization and design reuse, cycle times are reduced, manufacturing volumes are higher, and units can be inventoried at relatively low financial risk.

As will be described more fully below, and in another embodiment of the present invention, this concept is further extended to combine the functionality of the CPS of the present invention with the bus power electronics of a spacecraft to further reduce the weight on the spacecraft.

Figure 1:
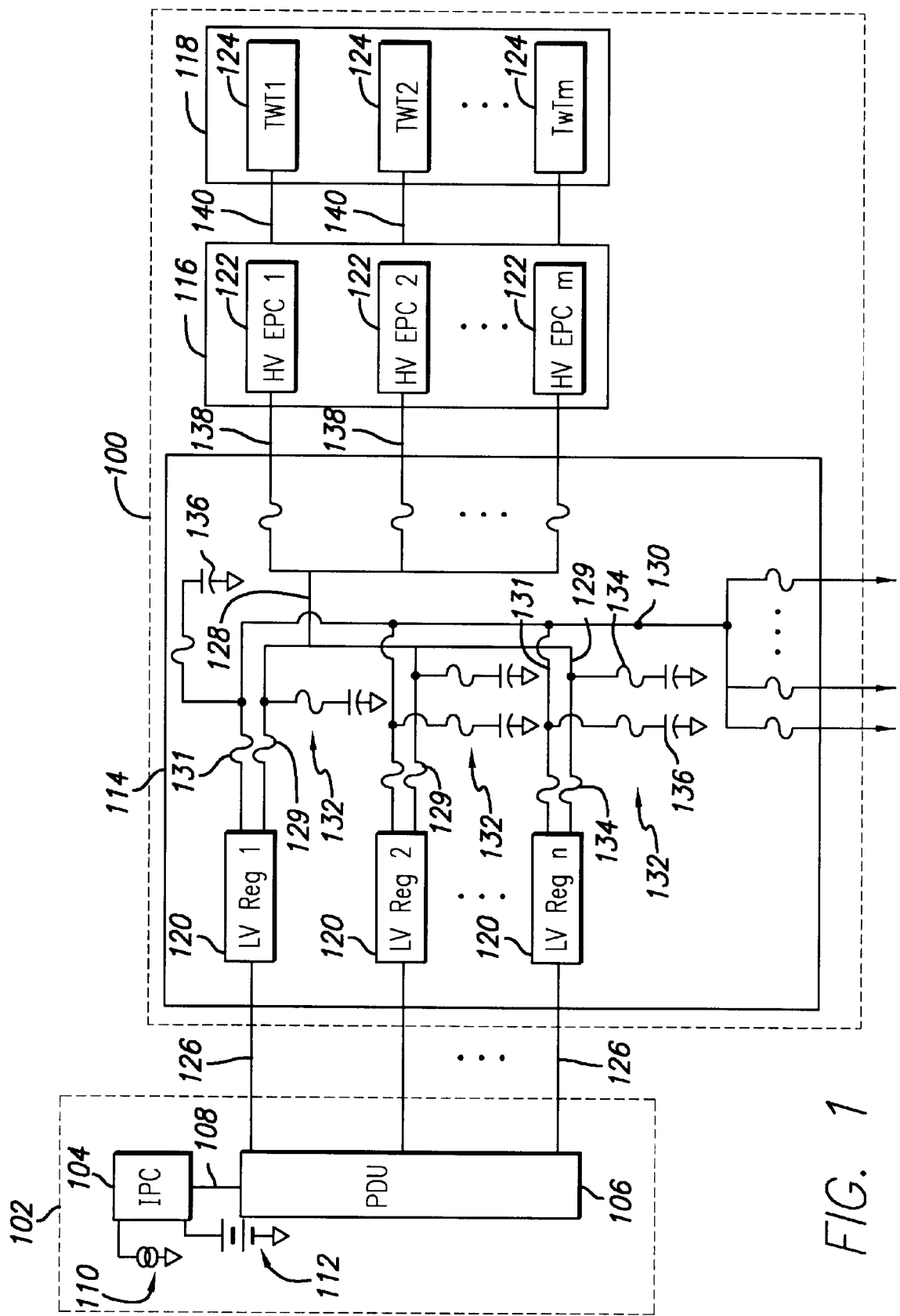
FIG. 1 is a block diagram illustrating a traveling wave tube amplifier subsystem of the present invention.

Reference will now be made to the drawings wherein like numerals refer to like parts throughout. FIG. 1 shows a block diagram illustrating a microwave tube amplifier system 100 of the present invention that is connected to and powered by an electrical power system 102 of a spacecraft (not shown) such as a satellite. The power system 102 may comprise a power regulator 104 or integrated power controller (IPC) which is connected to a power distribution unit (PDU) 106 through a primary power bus 108. The IPC 104 regulates the power from a solar array 110 and a battery 112 of the of the power system 102 of the spacecraft and provides a constant power output or primary output voltage ($V_{bus}$). The IPC 104 limits the power from the solar array 110 during sunlight, provides battery discharge control during eclipse, and charge control for the battery 112 during the sunlight. The power bus 108 connects the primary power output with the PDU 106. The PDU provides fusing and fault isolation functions.

The microwave tube amplifier system 100 may comprise a first power converter subsystem 114, a second power converter subsystem 116, and a microwave tube subsystem 118. In the preferred embodiment, the microwave tube amplifier system 100 may be a plurality of traveling wave tube amplifiers (TWTA). Accordingly, the first power converter 114 may be a central power conditioner subsystem (CPS subsystem) comprising a first predetermined number "n" of low voltage conditioner members 120. The second power converter subsystem 116 may be a high voltage power conditioner subsystem (HVEPC subsystem) comprising a second predetermined number "m" of high voltage conditioner members 122. The microwave tube subsystem 118 may then be a traveling wave tube (TWT) subsystem comprising a third predetermined number "m" of traveling wave tube members 124. In the preferred embodiment, the second predetermined number equals the third predetermined number. Accordingly, in the TWTA system 100, the number of traveling wave tube members 124 equals the number of high voltage conditioner members 122. The first predetermined number, however, may be less than the second or the third predetermined numbers. Consequently, the number of high voltage conditioner members 122 or the traveling wave tube members 124 are higher than the number of low voltage conditioner members 120.

The foregoing is an important aspect of the present invention and results in a significant weight reduction from the overall spacecraft weight, which differs from the prior art systems. Conventional systems generally use an electronic power conditioner unit containing an equal number of low voltage conditioners and high voltage conditioners that are paired through a connecting circuitry. In such systems, with many TWTAs, a large number of low voltage conditioners and related connecting circuitry adds to the weight of the spacecraft. As an example, the conventional electronic power conditioners on a typical "Bent Pipe" satellite (i.e., a communications satellite that receives radio frequency signals from Earth, shifts the carrier frequency of those signals, and retransmits those signals back to Earth) account for approximately 200 pounds or 20% of the weight of the electronics. With the present invention, however, this weight could be reduced by approximately 20%.

The CPS subsystem 114 provides a low voltage power supply for the TWTA system 100 and other circuitry on the spacecraft. The low voltage conditioner members 120 of the CPS subsystem 114 are low voltage power converters which are connected to one another in parallel. Each low voltage member 120 is electrically connected to the power distribution unit (PDU) 106 through power lines 126. As briefly mentioned before, in general, the PDU 106 receives power through the primary power bus 108 and provides fusing and fault isolation functions between the primary power bus 108 and the power lines 126. The CPS subsystem 114 provides a secondary power output ($V_{reg}$) through a secondary power bus 128 that is connected to the HVEPC subsystem 116. The secondary power bus 128 may be connected to the output lines 129 of each low voltage conditioner member 120 to receive output power of the low voltage conditioner members 120.

Further, an auxiliary bus 130 from the CPS subsystem 114 distributes an auxiliary power ($V_{aux}$) to auxiliary circuitry (not shown) of the spacecraft, for example, channel control units and driver amplifiers (not shown). The auxiliary power bus 130 may be connected to the output lines 131 of each low voltage conditioner member 120 to receive output power of the low voltage conditioner members 120. As discussed, the CPS subsystem 114 of the present invention combines the low voltage circuitry of the TWTA system 100 into a common redundant power supply. One advantage of this combined circuitry is that such configured CPS subsystem requires less circuitry and fewer low voltage power converters thereby resulting in lower spacecraft weight and volume. Another advantage is that by reducing the number of low voltage converters, less power is consumed in "house keeping" circuits, resulting in improved efficiency. House keeping circuits are circuits needed to maintain necessary internal power converter functions. Yet another advantage is that the secondary power output ($V_{reg}$) of the CPS subsystem 114 can be determined such that the efficiency and the weight of the HVEPC subsystem 116 can be optimized. Such predetermined or standardized secondary power output from the CPS allows the use of the same high voltage converters on a variety of available spacecraft systems. In such case, and depending on the primary bus power of a spacecraft, only the CPS subsystem 114 needs to be replaced, not the entire TWTA subsystem, thereby allowing improved product standardization and design reuse, reduced cycle times, higher manufacturing volumes, and ability to inventory units at relatively low financial risk.

In this embodiment, the CPS subsystem 114 may also be equipped with several protection features 132 to protect or isolate the TWTA system 100 from the failure of individual components, or power converters. One such protection feature may be fuse members 134 that are placed on the output lines 129, 131 of the low voltage conditioner members 120 for fault isolation. The fuse members 134 may also be placed in series with output capacitors 136 to provide further fault isolation from shorted capacitors.

Referring to FIG. 1, through the secondary bus 128, the secondary power output of the CPS subsystem 114 is delivered to the HVEPC subsystem 116. The secondary power output is distributed to the input lines 138 of the high voltage conditioner members 122 so that each of the high voltage members 122 can separately receive the secondary power output of the CPS subsystem 114. The high voltage conditioner members 122 are high voltage converters which transform the secondary power output into multiple high voltage biases for traveling wave tubes 124 so as to power them. The high voltage conditioner members 122 are connected to the traveling wave tube members 124 through output lines 140 of the high voltage conditioner members 122. In accordance with the principles of the present invention, the electrical connection between the high voltage conditioner members 122 and the traveling wave tube members 124 is configured such that the high voltage conditioner members 122 and the traveling wave tube members 124 are paired on a one-to-one basis, i.e., one high voltage conditioner member is connected to one traveling tube member and so on.

Figure 2:
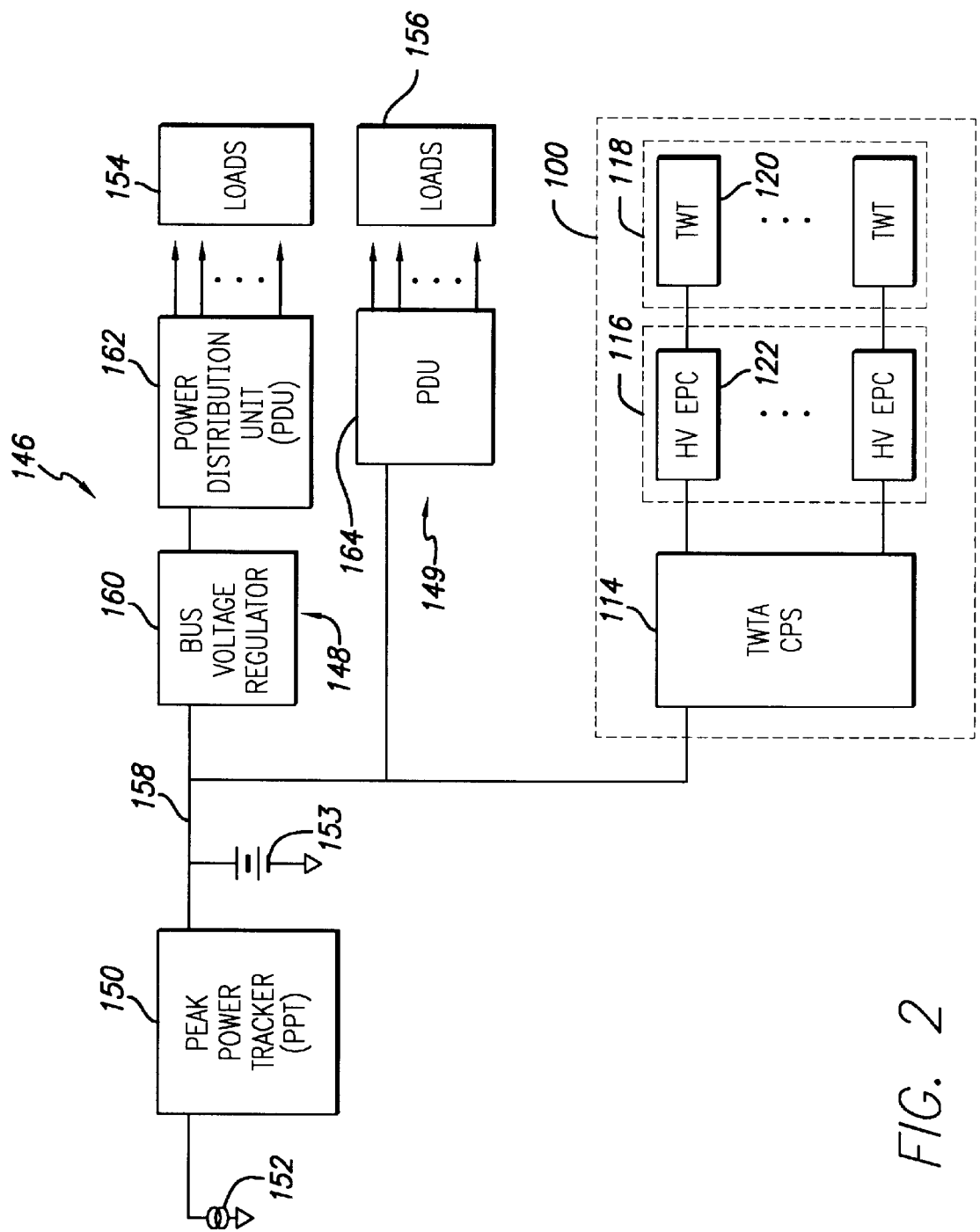
FIG. 2 is block diagram illustrating the traveling wave tube amplifier subsystem that integrated with a power subsystem of the present invention.

FIG. 2 shows a power system 146 of the present invention where the CPS subsystem 114 of the TWTA system 100 and two exemplary subsystems 148 and 149 are combined with a power subsystem 150. In this embodiment, the power subsystem 150 may be a peak power tracker (PPT). The PPT 150 receives the power from a solar array 152 and charges a battery 153. A primary bus power or voltage is distributed to exemplary first and second spacecraft loads 154, 156 of the first and second subsystems 148, 149 as well as to the TWTA system 100 via a primary bus 158. The peak power tracker allows the solar array to operate at a voltage that produces maximum power and shunts any excess power that may overcharge the battery 153. The first spacecraft load 154 may draw power from the battery through a bus voltage regulator 160 and a first power distribution unit (first PDU) 162 within the subsystem 148 while the second spacecraft load 156 may draw power through a second power distribution unit (second PDU) in the second subsystem 149. In this configuration, the combined weight of both the PPT 150 and the voltage regulator 160 is expected to be significantly less than the weight of the IPC 104 described in the previous embodiment and shown in FIG. 1. The CPS 114 of the TWTA system 100 operates directly off of the battery which has a very low impedance for improved TDMA (Time Division Multiple Access) performance. When the functionality of the CPS subsystem 114 is added into the power system 146, which is configured as shown in FIG. 2, the total weight of the power circuitry on the spacecraft may be reduced by over 100 pounds.

It should be understood, of course, that the foregoing relates to preferred embodiments of the invention and that modifications may be made without departing from the spirit and scope of the invention as set forth in the following claims.

I claim:
1. A microwave tube amplifier system comprising:
a microwave tube subsystem, wherein the microwave tube subsystem comprises a plurality of microwave tubes;
a first voltage converter subsystem electrically connected to and powering the microwave tube subsystem, wherein the first voltage converter subsystem comprises a plurality of first voltage converter members; and a second voltage converter subsystem electrically connected to the first voltage converter subsystem, wherein the second voltage converter subsystem comprises a plurality of second converter members connected in parallel to one another, and wherein a first predetermined power output of the second converter subsystem powers the first voltage converter subsystem.

2. A microwave tube amplifier system comprising:
a microwave tube subsystem, wherein the microwave tube subsystem comprises a plurality of microwave tubes;
a first voltage converter subsystem electrically connected to and powering the microwave tube subsystem, wherein the first voltage converter subsystem comprises a plurality of first voltage converter members; and
a second voltage converter subsystem electrically connected to the first voltage converter subsystem, wherein the second voltage converter subsystem comprises a plurality of second converter members connected in parallel to one another, wherein a first predetermined power output of the second converter subsystem powers the first voltage converter subsystem, and wherein the plurality of the microwave tube members are paired with the plurality of the first voltage converter members on a one-to-one basis through an output connector of the first voltage members.

3. The microwave tube amplifier system of claim 2, wherein the first voltage converter subsystem is comprised of a high voltage converter subsystem and the plurality of first voltage converter members are high voltage converter members.

4. The microwave tube amplifier system of claim 3, wherein the number of microwave tube members equals to the number of high voltage converter members.

5. The microwave tube amplifier system of claim 4, wherein the second voltage converter subsystem is a low voltage converter subsystem and the plurality of second converter members are low voltage converter members.

6. The microwave tube amplifier system of claim 5, wherein the number of low voltage converter members is less than the number of high voltage converter members or the microwave tube members.

7. The microwave tube amplifier system of claim 6, wherein the first predetermined power output of the low voltage converter subsystem is connected to each high voltage converter member.

8. The microwave tube amplifier system of claim 7, wherein the low voltage converter subsystem is a centralized power conditioner subsystem.

9. The microwave tube amplifier system of claim 8, wherein the plurality of microwave tubes are traveling wave tubes.

10. The microwave tube amplifier system of claim 9, further comprising a power distribution unit connected to the low voltage converter members, wherein the power distribution unit provides fusing for the centralized power conditioner subsystem.

11. The microwave tube amplifier system of claim 10, further comprising a power controller connected to the power distribution unit.

12. The microwave tube amplifier system of claim 11, wherein the power controller is connected to a solar array and regulates a first power from the solar array.

13. The microwave tube amplifier system of claim 12, wherein the power controller is connected to a battery and regulates a second power from the battery.

14. The microwave tube amplifier system of claim 13, wherein the power controller regulates the first and second powers from the solar array and the battery and provides a constant bus power for the power distribution unit.

15. The microwave tube amplifier system of claim 14, wherein the power controller regulates the first and second powers from the solar array and the battery and provides a constant bus power for the centralized power conditioner subsystem.

16. A power system for use with a traveling wave tube amplifier system comprising:
- a power controller for regulating a first power output from a first power supply and transforming the first power output into a regulated power output;
- a low voltage converter unit for receiving the regulated power output, the low voltage unit converts the regulated power output into a first predetermined power output, wherein the low voltage converter unit comprises a first number of low voltage converter members connected in parallel to one another;
- a high voltage converter unit comprising a second predetermined number of high voltage converter members electrically connected to the low voltage converter unit, each of the high voltage converter members receives the first predetermined power output of the low voltage unit and generates a high voltage power output, wherein the second predetermined number is higher than the first predetermined number; and
- a traveling wave tube unit comprising a plurality of traveling wave tube members, the tube members being paired with the high voltage converter members on a one-to-one basis such that the high voltage output of one of the high voltage members is received by one of the traveling tube members, wherein the number of pairs equals the second predetermined number.

17. The power system of claim 16, further comprising a battery charged by the regulated output prior to the regulated power output being received by the low voltage converter unit.

18. The power system of claim 17, wherein the first power supply is a solar array connected to the power controller.

19. The power system of claim 18, wherein the power controller is a peak power tracker.

20. The power system of claim 19, wherein the power tracker allows the solar array to operate at a voltage that maximizes the first power output.

21. The power system of claim 20, wherein if the first power output is higher than a predetermined level, the power tracker shunts a portion of the first power output that is over the predetermined level so as to prevent the battery from overcharging.

22. A power system for use with a microwave tube amplifier system comprising:
- a power controller for regulating a first power output from a first power supply and transforming the first power output into a regulated power output;
- a low voltage converter unit for receiving the regulated power output, the low voltage unit converts the regulated power output into a first predetermined power output, wherein the low voltage converter unit comprises a first number of low voltage converter members connected in parallel to one another;
- a high voltage converter unit comprising a second predetermined number of high voltage converter members electrically connected to the low voltage converter unit, each of the high voltage converter members receives the first predetermined power output of the low voltage unit and generates a high voltage power output, wherein the second predetermined number is higher than the first predetermined number; and
- a microwave tube unit comprising a plurality of microwave tube members, the tube members being paired with the high voltage converter members on a one-to-one basis such that the high voltage output of one of the high voltage members is received by one of the microwave tube members, wherein the number of pairs equals the second predetermined number.

23. The power system of claim 22, further comprising a battery charged by the regulated output prior to the regulated power output being received by the low voltage converter unit.

24. The power system of claim 23, wherein the first power supply is a solar array connected to the power controller.

25. The power system of claim 24, wherein the power controller is a peak power tracker.

26. The power system of claim 25, wherein the power tracker allows the solar array to operate at a voltage that maximizes the first power output.

27. The power system of claim 26, wherein if the first power output is higher than a predetermined level, the power tracker shunts a portion of the first power output that is over the predetermined level so as to prevent the battery from overcharging.

28. The power system of claim 27, wherein the plurality of microwave tubes are traveling wave tubes.

29. The microwave tube amplifier system of claim 28, further comprising a power distribution unit connected to the low voltage converter members, wherein the power distribution unit provides fusing for the centralized power conditioner subsystem.

30. The microwave tube amplifier system of claim 29, further comprising a power controller connected to the power distribution unit.

31. The microwave tube amplifier system of claim 30, wherein the power controller is connected to a solar array and regulates a first power from the solar array.

32. The microwave tube amplifier system of claim 31, wherein the power controller is connected to a battery and regulates a second power from the battery.

33. The microwave tube amplifier system of claim 32, wherein the power controller regulates the first and second powers from the solar array and the battery and provides a constant bus power for the power distribution unit.

34. The microwave tube amplifier system of claim 33, wherein the power controller regulates the first and second powers from the solar array and the battery and provides a constant bus power for the centralized power conditioner subsystem.

* * * * *